United States Patent [19]
Iinuma et al.

[11] Patent Number: 5,989,988
[45] Date of Patent: Nov. 23, 1999

[54] SEMICONDUCTOR DEVICE AND METHOD OF MANUFACTURING THE SAME

[75] Inventors: Toshihiko Iinuma; Kyoichi Suguro; Soichi Nadahara, all of Yokohama, Japan

[73] Assignee: Kabushiki Kaisha Toshiba, Kawasaki, Japan

[21] Appl. No.: 09/192,232

[22] Filed: Nov. 16, 1998

[30] Foreign Application Priority Data

Nov. 17, 1997 [JP] Japan ..................................... 9-315173
Jun. 10, 1998 [JP] Japan ................................... 10-162154

[51] Int. Cl.$^6$ ................. H01L 21/3205; H01L 21/4763; H01L 21/44
[52] U.S. Cl. ........................... 438/592; 438/682; 438/683
[58] Field of Search ................... 438/592, 682, 438/683

[56] References Cited

U.S. PATENT DOCUMENTS

| | | | |
|---|---|---|---|
| 4,663,191 | 5/1987 | Choi et al. | 427/93 |
| 5,624,869 | 4/1997 | Agnello et al. | 438/602 |
| 5,665,646 | 9/1997 | Kitano | 438/592 |
| 5,744,395 | 4/1998 | Shue et al. | 438/305 |
| 5,780,349 | 7/1998 | Naem | 438/305 |
| 5,851,891 | 12/1998 | Dawson et al. | 438/305 |

*Primary Examiner*—John F. Niebling
*Assistant Examiner*—Walter L. Lindsay, Jr.
*Attorney, Agent, or Firm*—Finnegan, Henderson, Farabow, Garrett & Dunner, L.L.P.

[57] ABSTRACT

A silicon region partitioned by insulating films is formed on a main surface of a substrate. A mixed film of first and second metals is formed directly or indirectly on the substrate having the silicon region formed thereon. Then, a heat treatment is applied to permit the first and second metals to react with silicon in the silicon region so as to form selectively a first silicide film on the surface of the silicon region. Further, the first silicide film is subjected to a heat treatment under a nitriding atmosphere so as to form a second silicide film consisting essentially of the first metal and silicon on the surface of the silicon region and a nitride film consisting essentially of the second metal and nitrogen on the surface of the second silicide film or both on the surface and at the crystal grain boundary of the second silicide film.

8 Claims, 11 Drawing Sheets

SEMICONDUCTOR DEVICE AND METHOD OF MANUFACTURING THE SAME

BACKGROUND OF THE INVENTION

The present invention relates to a semiconductor device and a method of manufacturing the same, particularly, to a fine MIS transistor having a short gate length.

A so-called SALICIDE (Self ALIgned siliCIDE) process has come to be used widely in order to cope with an increased parasitic resistance accompanying the miniaturization of the element in recent years. The salicide process is used for forming silicide films on a polycrystalline silicon gate electrode and source-drain regions of a MOSFET by self-alignment.

FIGS. 10A to 10F exemplify a conventional salicide process using titanium.

Figure 10A:
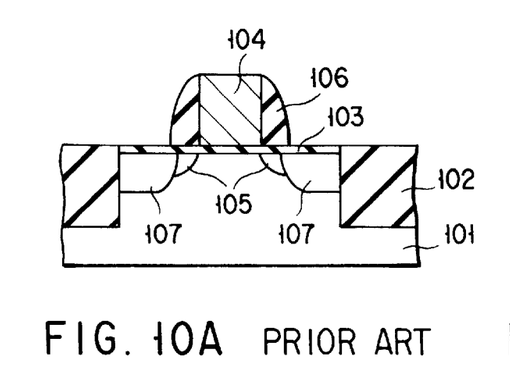
FIGS. 10A to 10F are cross sectional views collectively showing a conventional manufacturing method of a semiconductor device.

In the first step, an element isolation region 102 consisting of a silicon oxide film is formed on a silicon substrate 101, followed by forming a gate oxide film 103, a polycrystalline silicon gate electrode 104 and shallow source-drain regions 105 of a MOSFET, as shown in FIG. 10A. Further, deep source-drain diffusion layers 107 are formed by using side wall films 106 each consisting of silicon nitride as a mask.

Figure 10B:
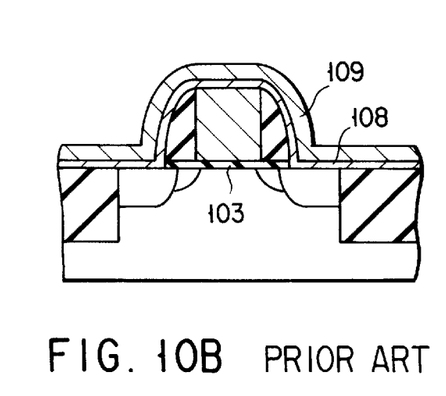

Then, a treatment with a dilute hydrofluoric acid, followed by, as desired, an RCA treatment, is applied to deposit a titanium film 108 and a titanium nitride (TiN) film 109 on the entire surface, as shown in FIG. 10B.

Figure 10C:
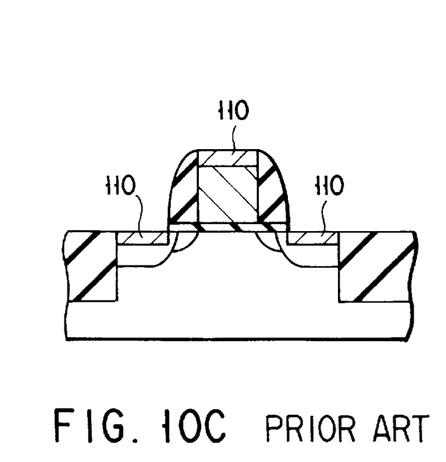

Further, an annealing treatment is carried out for a short time at 650 to 750° C. by using a lamp annealing apparatus or the like. By this annealing treatment, reactions are carried out between the silicon substrate 101 and the titanium film 108, and the polycrystalline silicon film 104 and the titanium film 108 so as to form a titanium disilicide ($TiSi_2$) film 110 having a C49 crystal structure. Then, the titanium nitride film 109 and the unreacted titanium film 108 are removed by etching using a mixture of sulfuric acid and hydrogen peroxide as an etchant, as shown in FIG. 10C.

Figure 10D:
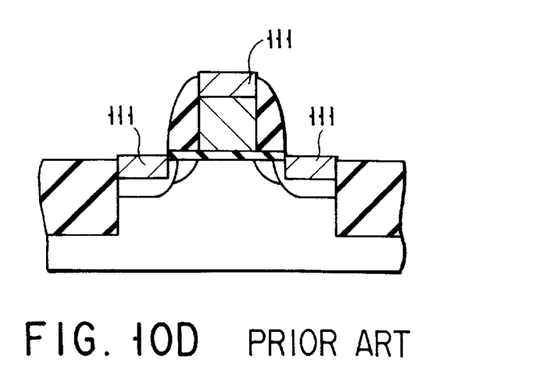
Figure 10E:
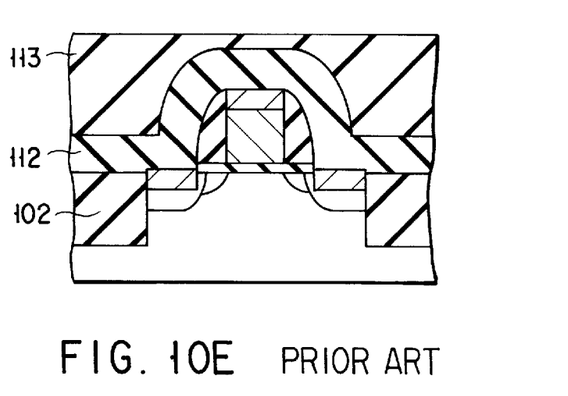

In the next step, an annealing treatment is performed for a short time at 750 to 900° C. by using a lamp annealing apparatus or the like so as to convert the titanium disilicide film 110 having the C49 crystal structure into a titanium disilicide ($TiSi_2$) film 111 of a low resistivity, said film 111 having a C54 crystal structure, as shown in FIG. 10D. After formation of the titanium disilicide film 111, silicon oxide films 112 and 113 are deposited on the entire surface by a low pressure CVD method and a plasma CVD method, followed by flattening the upper surface of the silicon oxide film 113 by, for example, a CMP (Chemical Mechanical Polishing) process, as shown in FIG. 10E.

Figure 10F:
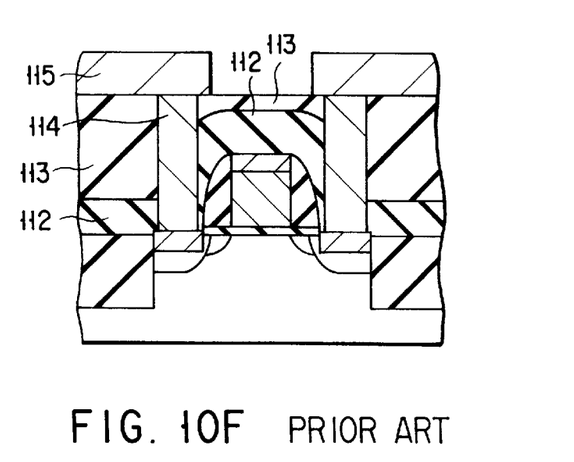

Finally, contact holes are made through the silicon oxide films 112 and 113, followed by burying a metal layer 114 such as a tungsten layer in the contact hole. Further, a wiring layer 115 made of, for example, aluminum is formed in a manner to be connected to the source-drain diffusion layers and the gate electrode, as shown in FIG. 10F.

The salicide process using titanium, which is described above, is effective for markedly decreasing the parasitic resistance of the source-drain diffusion layers and the poly-crystalline silicon gate electrode. However, if the gate length is decreased to 0.2 μm or less with progress in miniaturization of the element, the crystal structure of the $TiSi_2$ film is not converted into the C54 crystal structure by the second lamp annealing treatment. As a result, the resistance is not lowered so as to give rise to a so-called narrow line effect and, thus, to diminish the merit produced when the salicide process is employed for the manufacture of a semiconductor device.

Under the circumstances, a salicide process using a cobalt silicide, which is unlikely to bring about the narrow line effect compared with titanium silicide, attracts attentions in recent years.

FIGS. 11A to 11D exemplify the salicide process using cobalt silicide.

Figure 11A:
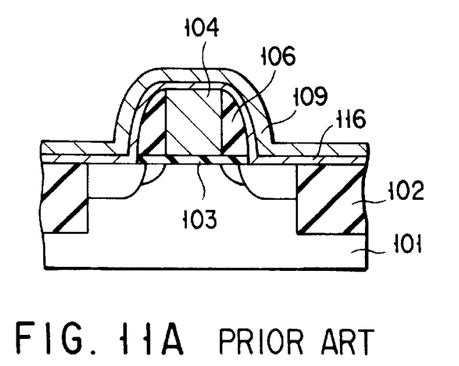
FIGS. 11A to 11D are cross sectional views collectively showing another conventional manufacturing method of a semiconductor device.

In the first step, a treatment with a dilute hydrofluoric acid is applied to the MOSFET under the state of FIG. 10A so as to remove the native oxide film on the surfaces of the silicon substrate 101 and the polycrystalline silicon film 104, followed depositing a cobalt film 116 and a titanium nitride film 109 on the entire surface, as shown in FIG. 11A.

Figure 11B:
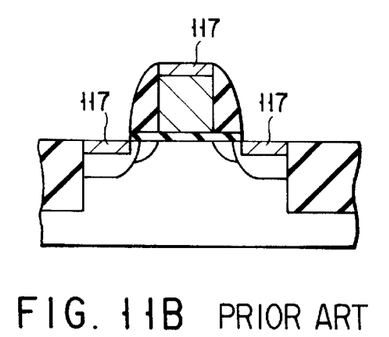

Then, an annealing treatment is performed for a short time at about 450 to 550° C. by using, for example, a lamp annealing apparatus. By this lamp annealing treatment, reactions are carried out between the silicon substrate 101 and the cobalt film 116, and the polycrystalline silicon film 104 and the cobalt film 116 so as to form a cobalt monosilicide (CoSi) film 117. Then, the titanium nitride film 109 and the unreacted cobalt film 116 are removed by etching with an etchant such as a mixed solution consisting of sulfuric acid and hydrogen peroxide, as shown in FIG. 11B.

Figure 11C:
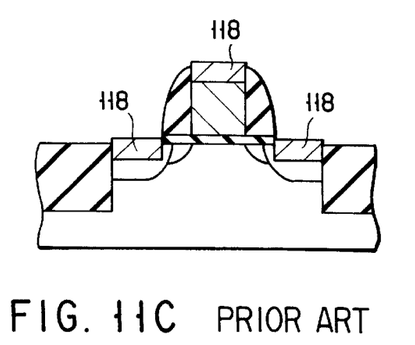

After the etching step, an annealing treatment is performed for a short time at 700 to 850° C. by using, for example, a lamp annealing apparatus. By this annealing treatment, the cobalt monosilicide film 117 is converted into a cobalt disilicide ($CoSi_2$) film 118 having a low resistivity, as shown in FIG. 11C.

Figure 11D:
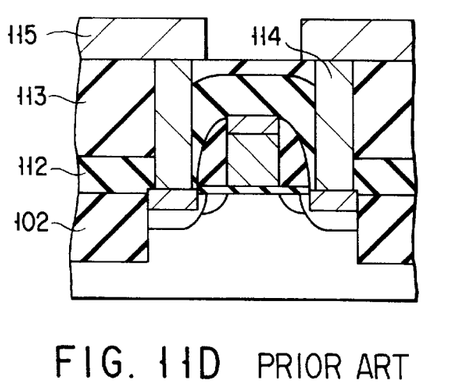

Further, silicon oxide films 112 and 113 are deposited on the entire surface by a low pressure CVD method and a plasma CVD method, followed by flattening the upper surface of the oxide film 113 by, for example, a CMP method. Still further, contact holes are made through these silicon oxide films 112, 113, followed by burying a metal layer 114 consisting of, for example, tungsten in these contact holes. Finally, a wiring layer 115 made of, for example, aluminum is formed in a manner to be connected to the source-drain diffusion layers and the gate electrode, as shown in FIG. 11D.

The salicide process using a cobalt silicide film, which is described above, is advantageous over the salicide process using a titanium silicide film in that a narrow line effect is unlikely to take place. However, serious problems remain unsolved in the salicide process using a cobalt silicide film, as described in the following.

Figure 12:
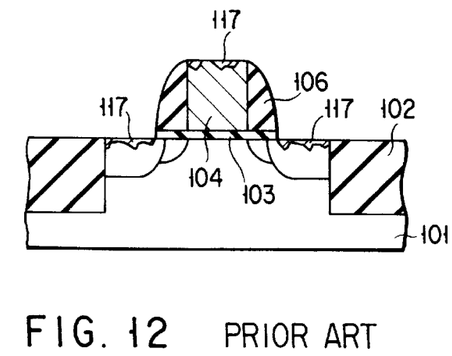
FIG. 12 is a cross sectional view showing a problem inherent in the conventional method.

It should be noted first of all that cobalt is inferior to titanium in the capability of reducing a silicon oxide film. Therefore, where a native oxide film formed after the RCA treatment is present on the surfaces of the silicon substrate and the poly-crystalline silicon film, the silicidation reaction is inhibited in the step of depositing cobalt, with the result that it is possible for the cobalt monosilicide film 117 shown in FIG. 11B not to be formed at all. It should also be noted that, where a cobalt film is deposited after removal of the native oxide film by the pretreatment with a dilute hydrofluoric acid, a nonuniform native oxide film is formed again with time after the pretreatment. As a result, the cobalt monosilicide film 117 is rendered nonuniform as shown in FIG. 12. Further, where only a treatment with a dilute hydrofluoric acid is employed as a pretreatment, a silicon-based oxide film called water mark or water glass is attached to the surfaces of the exposed silicon substrate and the polycrystalline silicon film, particularly to the boundary region with the element isolation film, with the result that the silicidation reaction is inhibited in some cases by the silicon-based oxide film.

Figure 13:
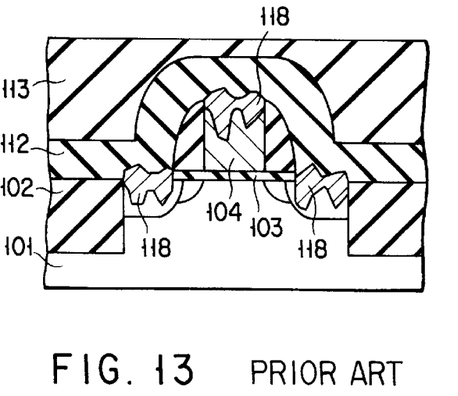
FIG. 13 is a cross sectional view showing another problem inherent in the conventional method.

Further, the cobalt silicide film is inferior to titanium silicide film in heat resistance. Therefore, a serious problem is brought about such that the cobalt disilicide film 118 is agglomerated as shown in FIG. 13 by the heat in the step of depositing a silicon oxide film after completion of the salicide process, giving rise to elevation of resistance.

On the other hand, various problems are generated in an amorphous silicon/aluminum replacement process which is included in the cobalt salicide process and is intended to decrease the resistance of the contact plug. Let us describe the problems inherent in the amorphous silicon/aluminum replacement process with reference to FIGS. 14A to 14C.

Figure 14A:
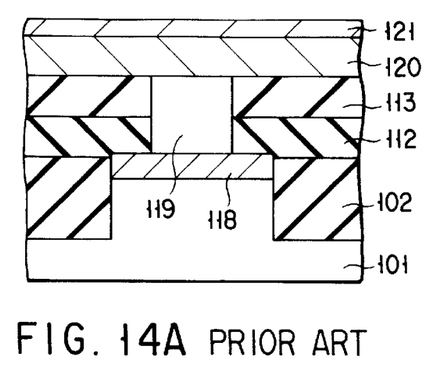
FIGS. 14A to 14C are cross sectional views collectively showing another conventional manufacturing method of a semiconductor device.

Specifically, interlayer insulating films 112 and 113 are deposited on the structure having a cobalt silicide film 118 as shown in FIG. 11C, followed by forming a contact hole through the interlayer insulating films 112, 113. Then, an amorphous silicon film 119 is deposited. The amorphous silicon film 119 is etched back so as to permit the amorphous silicon film 119 to be left only within the contact hole, followed by depositing an aluminum film 120 and a titanium film 121 on the entire surface, as shown in FIG. 14A.

Figure 14B:
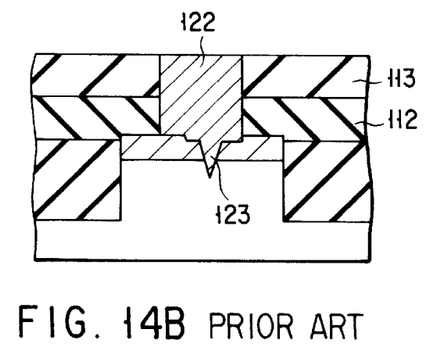
Figure 14C:
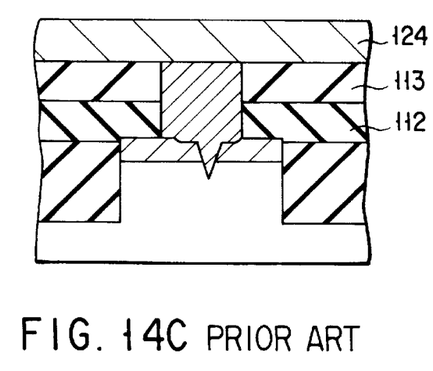

In the next step, a heat treatment is performed at 600° C. or less among the amorphous silicon film 119, the aluminum film 120 and the titanium film 121 so as to replace the amorphous silicon 119 within the contact hole by an aluminum layer 122. Then, the aluminum film 120 and the titanium film 121 positioned outside the contact hole as well as the silicon 119 sucked out by the replacement reaction are removed by, for example, a CMP process, as shown in FIG. 14B. Further, a wiring metal such as aluminum is deposited on the entire surface, followed by patterning the wiring metal layer so as to form a wiring layer 124 which is connected to the semiconductor element region, as shown in FIG. 14C.

However, a serious problem is generated in the case of forming a contact portion by the process described above. Specifically, an aluminum spike 123 bites the cobalt silicide film 118 in the heating step for replacement of the amorphous silicon with aluminum. In some cases, the spike 123 reaches the diffusion layer. Occurrence of the aluminum spike 123 causes deterioration of the bonding characteristics.

Figure 15A:
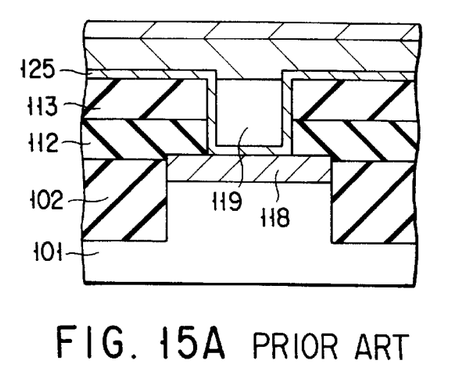
FIGS. 15A to 15C are cross sectional views collectively showing still another conventional manufacturing method of a semiconductor device.
Figure 15B:
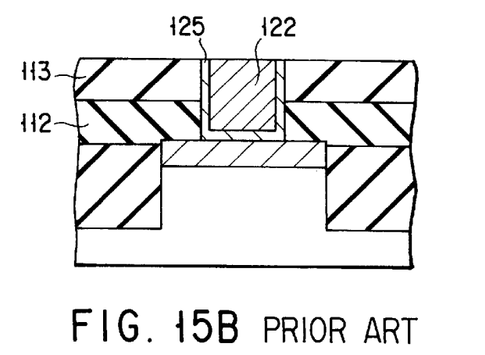
Figure 15C:
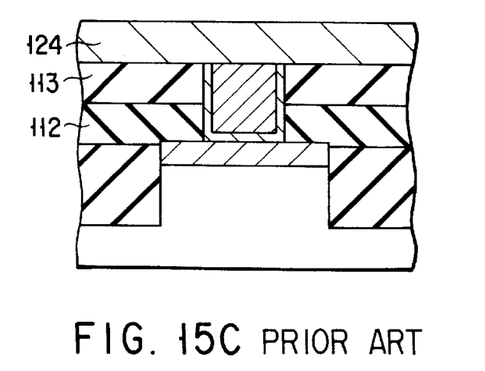

In order to prevent the occurrence of the aluminum spike, it is known to the art to form in advance a titanium nitride film effective as a diffusion barrier within the contact hole. FIGS. 15A to 15C show the process for forming a titanium nitride film in advance in the contact hole.

In the first step, interlayer insulating films 112 and 113 are deposited on the structure having a cobalt silicide film 118 as shown in FIG. 11, followed by forming a contact hole through these insulating films 112, 113. Then, a titanium nitride film 125 and an amorphous silicon film 119 are deposited successively, followed by etching back the amorphous silicon film 119 so as to permit the film 119 to be left only within the contact hole. Further, an aluminum film 120 and a titanium film 121 are deposited on the entire surface, as shown in FIG. 15A.

In the next step, reactions among the amorphous silicon film 119, the aluminum film 120 and the titanium film 121 are carried out by the heating at 600° C. or less so as to replace the amorphous silicon 119 within the contact hole by an aluminum film 122. Then, the aluminum film 120, the titanium film 121 and the titanium nitride film 125, which are positioned outside the contact hole, as well as the silicon 119 sucked out by the replacement reaction, are removed by, for example, a CMP process, as shown in FIG. 15B. Finally, a wiring metal layer 124 such as an aluminum layer is deposited on the entire surface, followed by patterning the wiring metal layer 124 so as to form a wiring layer which is connected to the semiconductor element region, as shown in FIG. 15C.

The process described above makes it possible to prevent an aluminum spike from biting a silicide layer and a diffusion layer below the silicide layer. However, the particular process necessitates an additional step of forming a titanium nitride film. In addition, the titanium nitride film has a high resistivity, leading to elevation of resistance in the contact portion.

As described above, the salicide process using titanium is defective in that, if the gate length is 0.2 $\mu$m or less, the resistance is prevented from being lowered sufficiently by the narrow line effect.

The salicide process using cobalt is defective in that the silicidation reaction is inhibited by a native oxide film, and that the silicide is agglomerated in the heating step for depositing interlayer insulating films. The salicide process using cobalt is also defective in that an aluminum spike bites the cobalt silicide layer in the amorphous silicon/aluminum replacement process. In order to prevent generation of the aluminum spike, it is certainly effective to form in advance a titanium nitride film or the like as a diffusion barrier within the contact hole. However, this process necessitates an additional step of forming a titanium nitride film. Also, the presence of the titanium nitride film causes an increased resistance in the contact portion.

BRIEF SUMMARY OF THE INVENTION

An object of the present invention is to provide a semiconductor device which permits suppressing an increase of resistance in a silicide-formed region and which is excellent in the process stability and a method of manufacturing the same.

According to a first aspect of the present invention, there is provided a semiconductor device, comprising a silicide film formed selectively on a surface of a silicon region partitioned by insulating films and consisting essentially of a first metal and silicon, and a nitride film formed on a surface of the silicide film and/or at a crystal grain boundary of the silicide film and consisting essentially of a second metal and nitrogen.

It suffices for the nitride film to be formed on the surface of the silicide film and/or at the crystal grain boundary of the silicide film. It follows that the present invention covers the cases where the nitride film is formed on the silicide film, where the nitride film is formed at the crystal grain boundary of the silicide film, and where the nitride film is formed on the surface of the silicide film and at the crystal grain boundary of the silicide film.

The silicon region includes at least one of a polycrystalline silicon region constituting a gate electrode of a MIS transistor and a single crystalline silicon region constituting the source-drain diffusion regions of the MIS transistor.

The first metal includes cobalt (Co), nickel (Ni), platinum (Pt) and palladium (Pd). Further, the second metal includes titanium (Ti), zirconium (Zr), hafnium (Hf), vanadium (V), niobium (Nb) and tantalum (Ta).

The insulating film includes an element isolation insulating film and a gate side wall insulating film. Further, it is possible for the nitride film to contain silicon in addition to the second metal and nitrogen.

In the present invention, the parasitic resistance in the gate region or the source-drain diffusion region can be sufficiently decreased even if the MIS transistor is miniaturized. Also, where a metal or the like is buried in an opening above the gate electrode or source-drain diffusion layer, the nitride film formed selectively on the surface of the silicide film makes it possible to suppress an increase of resistance caused by narrowing of the opening, compared with the case where a nitride film is also formed on the side wall of the opening.

According to a second aspect of the present invention, there is provided a method of manufacturing a semiconductor device, comprising the step of forming a silicon region partitioned by insulating films on a main surface region of a substrate, the step of forming a mixed film of first and second metals directly or indirectly on the substrate having the silicon region formed therein, and the step of selectively forming by a heat treatment a silicide film on the surface of the silicon region by the reaction between the metal within the mixed film and silicon in the silicon region.

It is desirable for the manufacturing method of the present invention to include at least one of processes (A) to (C) given below.

(A) The step of selectively forming by a heat treatment a silicide film on the surface of the silicon region by the reaction between the metal within the mixed film and silicon in the silicon region includes the process of selectively forming by a heat treatment a first silicide film on the surface of the silicon region by the reaction among the first metal, the second metal and silicon in the silicon region, and the process of subjecting the first silicide film to a heat treatment under a nitriding atmosphere so as to form a second silicide film consisting essentially of the first metal and silicon on the surface of the silicon region and a nitride film consisting essentially of the second metal and nitrogen on the surface of the second silicide film or both on the surface of the second silicide film and at the crystal grain boundary of the second silicide film.

Process (A) given above makes it possible for a native oxide film or the like on the silicon region to be reduced by the second metal, leading to formation of a satisfactory silicide film on the silicon region. Also, since a nitride film consisting essentially of the second metal and nitrogen is formed on the surface of the second silicide film, it is possible to overcome the problem that the thermal stability of the silicide film is lowered. It follows that it is possible to retain a high process stability and to lower the parasitic resistance in the gate region or the source-drain region, even if the MIS transistor is miniaturized.

(B) The step of forming a mixed film of first and second metals directly or indirectly on the substrate having the silicon region formed therein includes the process of forming a silicon oxide film on the surface of the silicon region, and the process of forming a mixed film of the first and second metals on the substrate having the silicon oxide film formed thereon. Also, the step of selectively forming by a heat treatment a silicide film on the surface of the silicon region by the reaction between the metal within the mixed film and silicon in the silicon region includes the process of allowing the silicon oxide film formed by the heat treatment on the surface of the silicon region to be reduced by the second metal, and the process of selectively forming by a heat treatment a silicide film on the surface of the silicon region by the reaction between the first metal and silicon in the silicon region. Incidentally, the processes for reducing the silicon oxide film and for forming the silicide film can be carried out by the same heat treatment.

In process (B) given above, an amorphous layer is formed at the interface between the mixed film of the first and second metals and the silicon region in the step of having the silicon oxide film reduced by the second metal. The amorphous layer permits growing a single crystalline silicide film at the interface between the amorphous layer and the silicon region so as to improve the uniformity of the silicide film. It follows that it is possible to manufacture a device having a high process stability and excellent in characteristics, even if the MIS transistor is miniaturized.

In order to permit the silicon oxide film to be reduced sufficiently by the second metal in process (B), it is desirable for the thickness of the silicon oxide film formed on the surface of the silicon region to be set at a value not larger than the value obtained by multiplying the thickness of the mixed film by a ratio of the second metal in the mixed film (ratio of the number of atoms of the second metal to the number of atoms of both first and second metals). If the silicon oxide film is unduly thin in process (B), the amorphous layer is rendered thin so as to make it difficult to form a single crystalline silicide film. Therefore, it is desirable to set the thickness of the silicon oxide film formed on the surface of the silicon region at 0.5 nm or more.

(C) The step of selectively forming by a heat treatment a silicide film on the surface of the silicon region by the reaction between the metal within the mixed film and silicon in the silicon region includes the heat treatment under a nitriding atmosphere to form a silicide film consisting essentially of the first metal and silicon on the surface of the silicon region and a nitride film consisting essentially of the second metal and nitrogen at the crystal grain boundary of the silicide film.

The first metal used in the second aspect of the present invention includes cobalt (Co), nickel (Ni), platinum (Pt), and palladium (Pd). On the other hand, the second metal includes titanium (Ti), zirconium (Zr), hafnium (Hf), vanadium (V), niobium (Nb) and tantalum (Ta). It is desirable to form a mixed film of the first and second metals by means of sputtering.

According to a third aspect of the present invention, there is provided a method of manufacturing a semiconductor device, comprising the step of selectively forming a silicide film consisting essentially of a first metal and silicon on a surface of a silicon region partitioned by first insulating films on a main surface of a substrate and a nitride film consisting essentially of a second metal and nitrogen on the surface of the silicide film or both on the surface of the silicide film and at the crystal grain boundary of the silicide film, the step of forming a second insulating film, the second insulating film having an opening on the nitride film, the step of burying amorphous silicon in the opening, the step of forming an aluminum layer on the amorphous silicon layer (generally, a titanium layer is further formed on the aluminum layer), and the step of applying a heat treatment to have the amorphous silicon layer replaced by the aluminum layer so as to bury an aluminum layer in the opening.

In the manufacturing method according to the third aspect of the present invention, a nitride film is formed in advance on the surface of a silicide film, making it possible to prevent occurrence of an aluminum spike. Also, since it is unnecessary to deposit a nitride film within the opening, an increase in the number of process steps can be suppressed. It is also possible to suppress an increase of resistance caused by narrowing of the opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe embodiments of the present invention with reference to the accompanying drawings.

FIGS. 1A to 1F collectively show a first embodiment of the present invention.

Figure 1A:
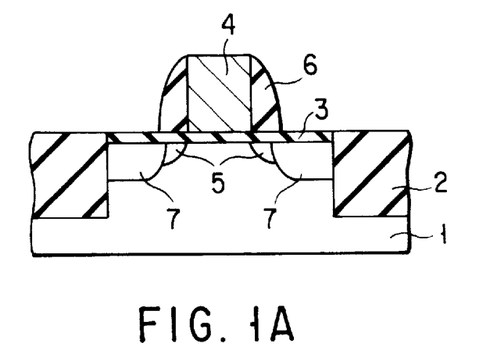
FIGS. 1A to 1F are cross sectional views collectively showing a manufacturing method of a semiconductor device according to a first embodiment of the present invention.

In the first step, an insulating film 2 for element isolation (silicon oxide film) is formed on a silicon substrate 1, followed by forming a gate oxide film 3, a gate electrode 4 consisting of poly-crystalline silicon and shallow source-drain regions 5 of a MOSFET. Then, a gate side wall film 6 consisting of silicon nitride is formed, followed by forming deep source-drain diffusion layers 7 by using the gate side wall film 6 as a mask, as shown in FIG. 1A.

Figure 1B:
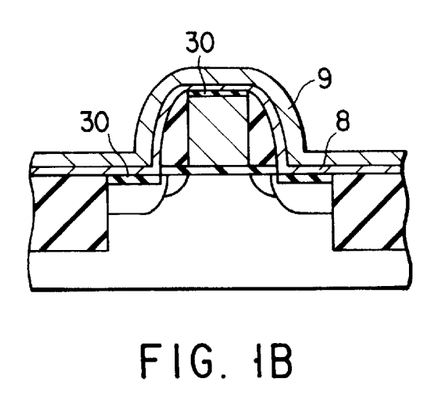

In the next step, a silicon oxide film (native oxide film) formed on the surfaces of the gate electrode 4 and the deep source-drain diffusion layers 7 are removed by treatment with a dilute hydrofluoric acid or the like, followed by applying a surface treatment using a mixed solution consisting of an aqueous solution containing an oxidizing agent such as ozone or hydrogen peroxide and hydrochloric acid, sulfuric acid or ammonia water. By this surface treatment, thin silicon oxide films 30 are formed uniformly on the surfaces of regions where silicide films are to be formed. Then, a cobalt film 8 containing about 5 to 30% of titanium is deposited on the entire surface by sputtering, followed by depositing a titanium nitride film 9 on the cobalt film 8, as shown in FIG. 1B. Incidentally, it is possible to omit deposition of the titanium nitride film 9.

Figure 1C:
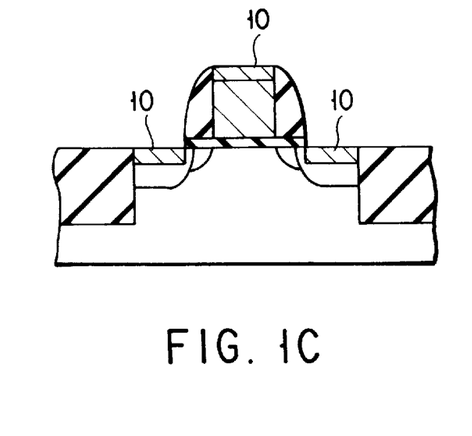

Then, an annealing treatment is performed for a short time at about 550 to 700° C. by using, for example, a lamp annealing apparatus. By this annealing treatment, reactions are carried out between the silicon substrate 1 and the cobalt film 8 containing titanium, and the polycrystalline silicon film 4 and the cobalt film 8 to form a cobalt monosilicide (CoSi) film 10 containing titanium. After formation of the cobalt monosilicide film 10, the titanium nitride film 9 and the unreacted cobalt film 8 containing titanium are removed by etching with an etchant consisting of a mixed solution containing sulfuric acid and hydrogen peroxide, as shown in FIG. 1C.

Figure 1D:
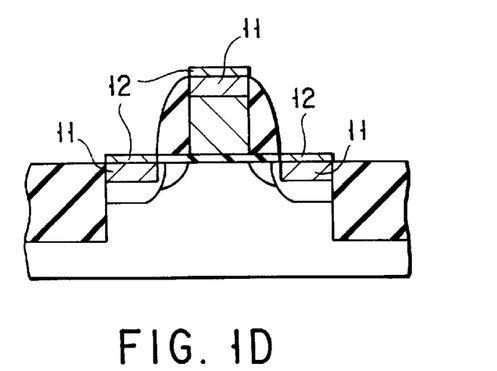
Figure 1E:
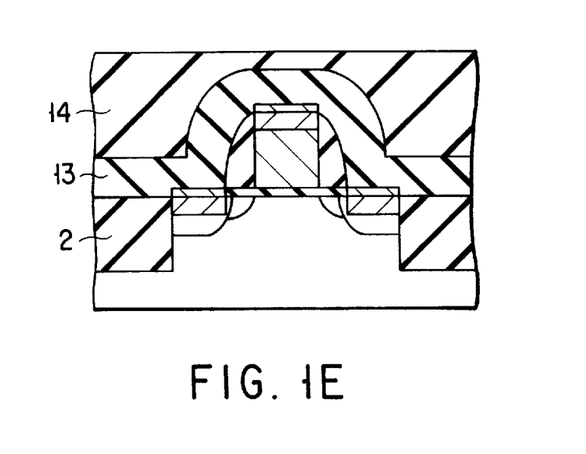

Further, an additional annealing treatment is carried out for a short time at 800 to 900° C. under a nitrogen or ammonia gas atmosphere by using, for example, a lamp annealing apparatus. By this annealing treatment, the cobalt monosilicide film 10 containing titanium is converted into a cobalt disilicide ($CoSi_2$) film 11 having a low resistivity. At the same time, titanium contained in the film 10 is sucked out by a nitriding reaction carried out on the film surface so as to form selectively a titanium nitride film 12 on the surface of the cobalt disilicide film 11, as shown in FIG. 1D. After formation of the titanium nitride film 12, silicon oxide films 13 and 14 are formed on the entire surface by a low pressure CVD method and a plasma CVD method, followed by flattening the upper surface of the silicon oxide film 14 by, for example, a CMP method, as shown in FIG. 1E.

Figure 1F:
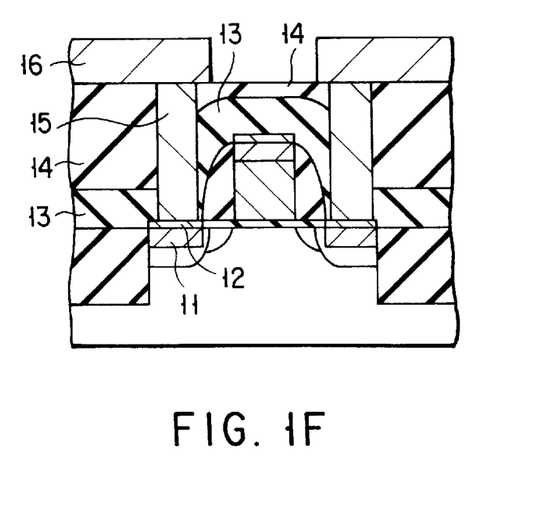

Then, contact holes are formed through the silicon oxide films 13 and 14, followed by burying a metal film 15 such as a tungsten film, which acts as a contact plug, in each of the contact holes. Finally, a wiring layer 16 made of, for example, aluminum is formed in a manner to be connected to the source-drain diffusion layers and the gate electrode, as shown in FIG. 1F.

As described above, the cobalt disilicide ($CoSi_2$) film 11 is formed selectively on the polycrystalline silicon gate electrode 4 and the source-drain diffusion layer 7 in the first embodiment of the present invention. In addition, the titanium nitride film 12 is formed selectively on the surface of the cobalt disilicide film 11. In this embodiment, a single crystalline cobalt disilicide film is formed by the formation of the thin silicon oxide film 30. Where the cobalt disilicide layer is polycrystalline, a titanium nitride film is selectively formed at the crystal grain boundary, too.

The embodiment shown in FIGS. 1A to 1F permits decreasing the parasitic resistance in a device in which the gate length is 0.2 μm or less. Also, since titanium which permits effectively reducing a silicon oxide film is contained in the cobalt film, it is possible to solve the problem inherent in the conventional salicide process. Specifically, it is possible to prevent the silicidation reaction from being inhibited by the native oxide film. It is also possible to solve the problem of the water mark formation generated in the pretreatment with hydrofluoric acid. In addition, since a titanium nitride film exhibiting a high heat resistance is formed by self-alignment on the surface of the cobalt disilicide (CoSi$_2$) film, it is also possible to solve the problem that the cobalt disilicide film is agglomerated by the heat in the step of depositing a silicon oxide film (interlayer insulating film). Further, since the titanium nitride film is formed selectively on the surface of the cobalt disilicide film, an increase in resistance caused by narrowing of the contact hole can be suppressed, compared with the case where a titanium nitride film is also formed on the side wall of the contact hole.

The thickness of the silicon oxide film 30 formed on the gate electrode 4 and on the source-drain diffusion layer 7 as shown in FIG. 1B is determined by the thickness (T) and the titanium concentration (N) of the cobalt film 8 containing titanium. In other words, the amount of titanium contributing to reduction of the silicon oxide film is T×N in terms of the effective thickness of the Ti portion of the Co—Ti alloy film.

Figure 4:
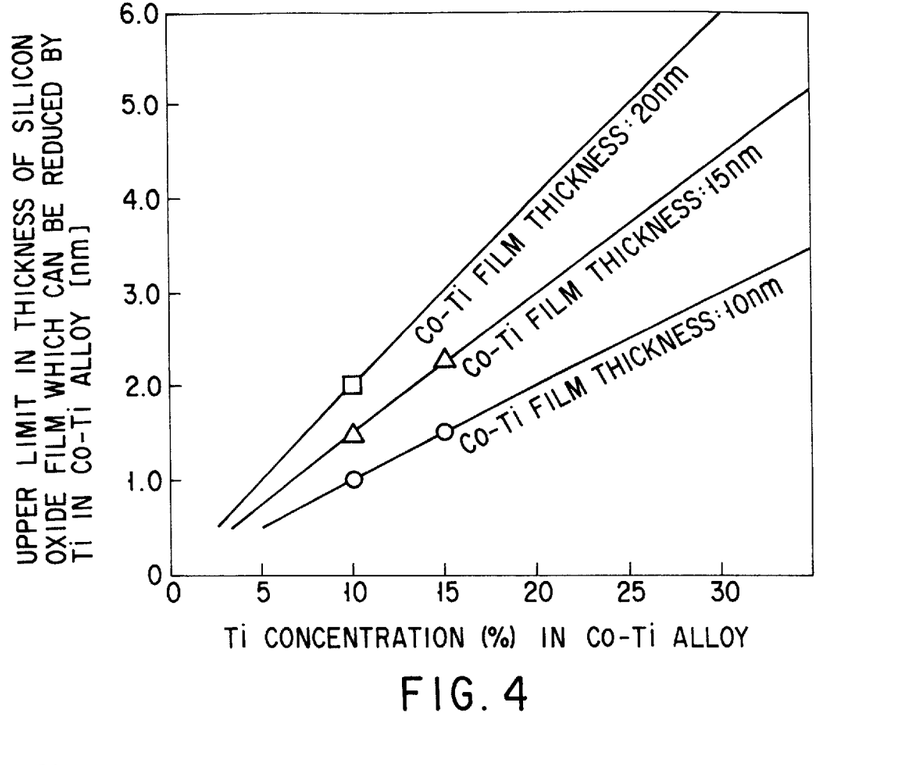
FIG. 4 is a graph showing the upper limit in the thickness of the silicon oxide film which can be reduced by titanium contained in a cobalt-titanium alloy.

FIG. 4 is a graph showing experimental data on the upper limit in the thickness of the silicon oxide film which can be reduced by Ti contained in the Co film containing Ti (i.e., Co—Ti alloy film), which is plotted on the ordinate, relative to the Ti concentration (atomic %) of the Co—Ti film, which is plotted on the abscissa. The experimental data cover the cases where the Co—Ti film has a thickness of 10 nm, 15 nm or 20 nm. Where, for example, the Co—Ti alloy film has a thickness (T) of 10 nm and a Ti concentration (N) of 10%, the effective thickness of the Ti portion of the alloy film is T×N=1 nm. On the other hand, where the Co—Ti alloy film has a thickness (T) of 10 nm and a Ti concentration (N) of 10%, the upper limit in the thickness of the silicon oxide film which can be reduced by Ti contained in the Co—Ti film is 1 nm, as shown in FIG. 4. In other words, the upper limit in the thickness of the silicon oxide film which can be reduced by Ti contained in the Co—Ti film is substantially equal to the effective thickness (T×N) of the Ti portion of the Co—Ti alloy film. This is supported by the experimental data given in the graph of FIG. 4. It follows that, in order to obtain a uniform cobalt silicide film, it is desirable to control the thickness of the silicon oxide film on the surface of silicon at a value not larger than the effective thickness (T×N) of the Ti portion of the Co—Ti alloy film.

Figure 5:
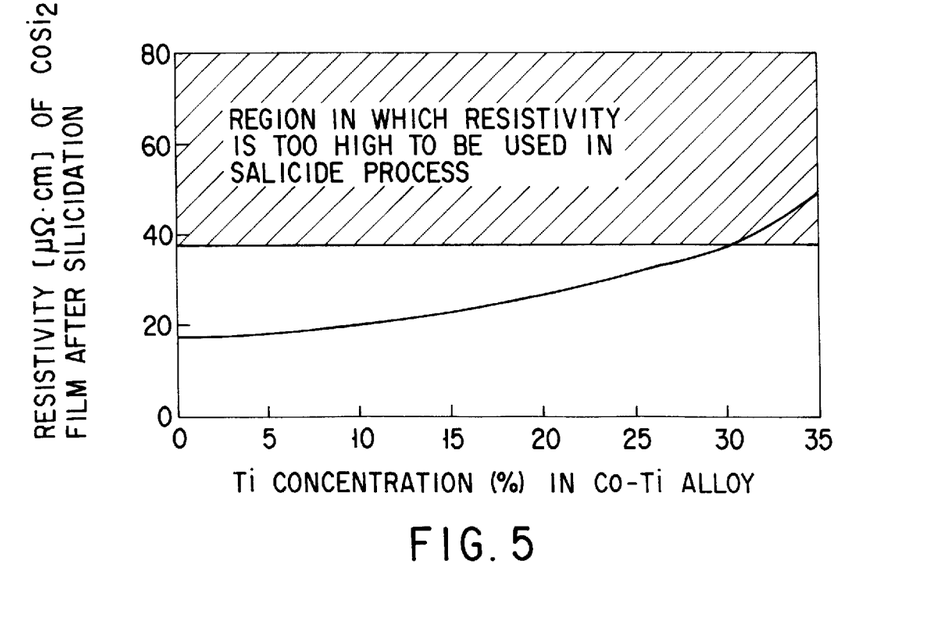
FIG. 5 is a graph showing the upper limit in the titanium concentration of a cobalt-titanium alloy.

It is also necessary to limit the Ti concentration of the Co—Ti film in view of the resistivity of the cobalt silicide film to be formed. FIG. 5 is a graph showing the relationship between the Ti concentration of the Co—Ti alloy film and the resistivity of the cobalt silicide film to be formed. FIG. 5 clearly shows that the resistivity of the cobalt silicide film is increased with increase in the Ti concentration of the Co—Ti film. As apparent from FIG. 5, the resistivity of the cobalt silicide film, which is dependent on the heating step for forming a cobalt silicide film, is increased to exceed the acceptable range if the Ti concentration of the Co—Ti alloy film exceeds 30%. It follows that it is desirable to control the Ti concentration of the Co—Ti alloy film at 30% or less.

Figure 6:
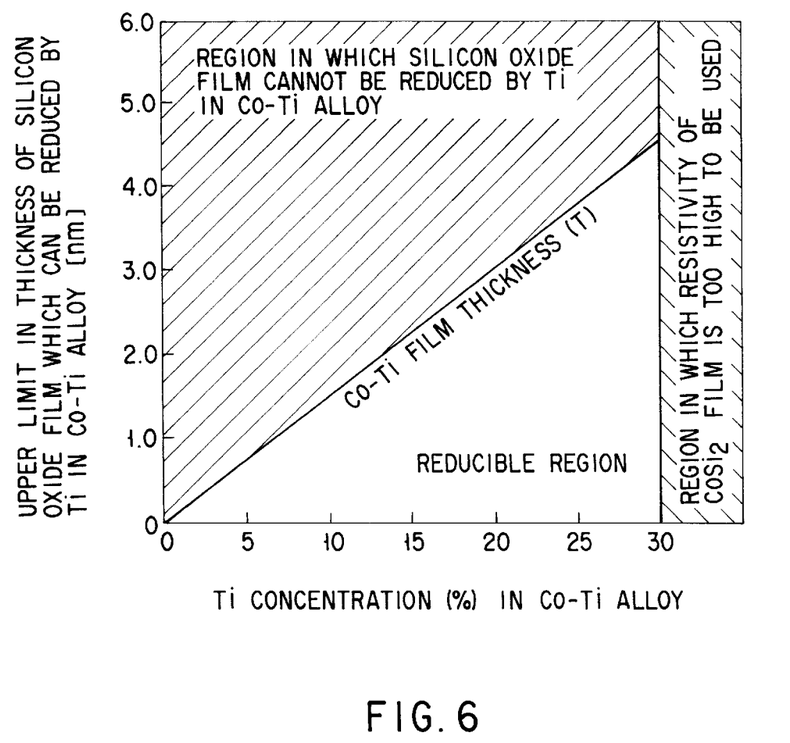
FIG. 6 is a graph showing a desired range of titanium concentration of a cobalt-titanium alloy.

Under the circumstances, it is desirable to set the thickness of the silicon oxide film on the surface of the silicon region to fall within a range shown in FIG. 6 in order to obtain a uniform cobalt silicide film.

Figure 7:
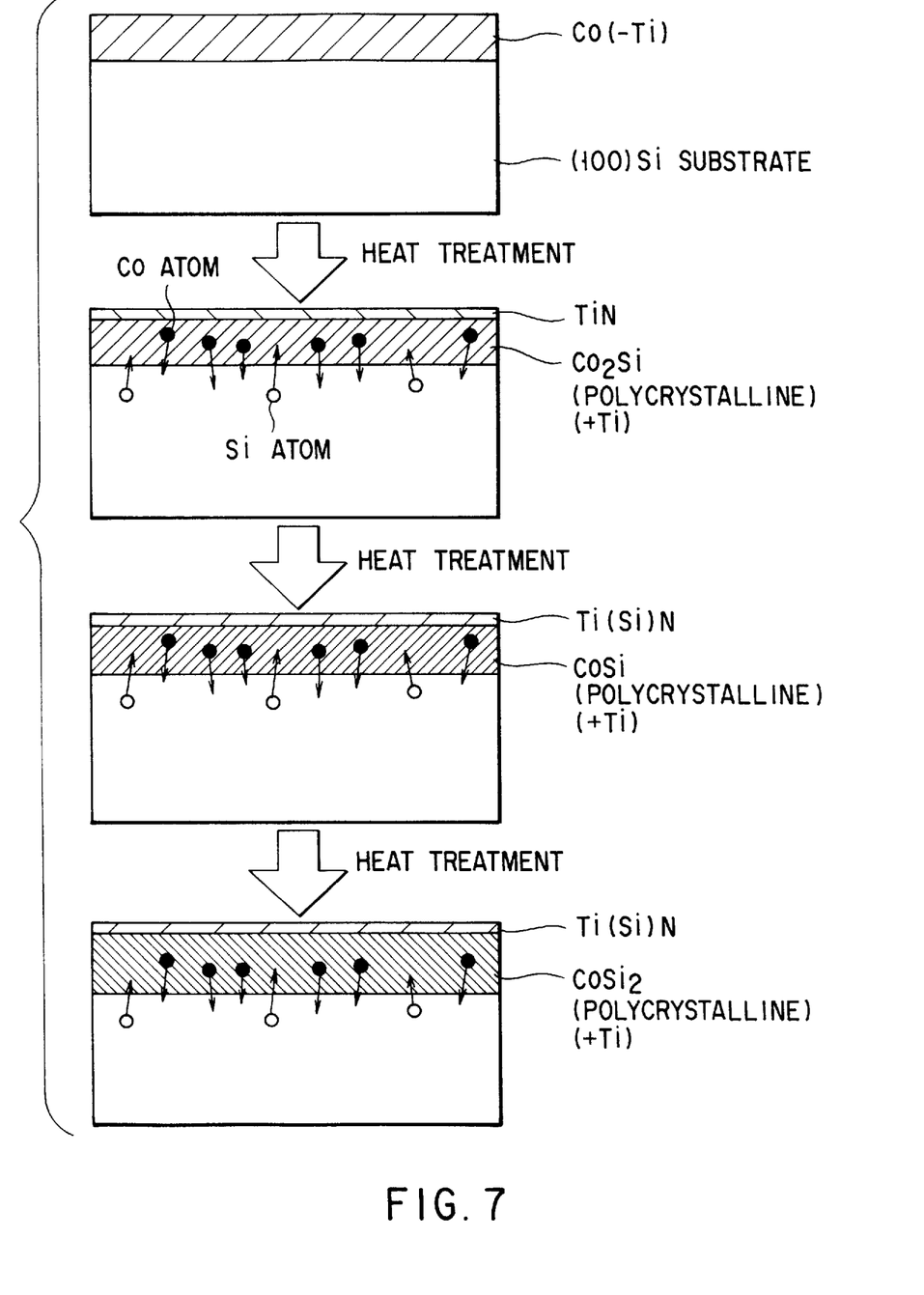
FIG. 7 schematically illustrates a silicidation reaction covering a case where a silicon oxide film is not present on the silicon surface in the step of depositing a cobalt-titanium alloy.

In this embodiment, it is possible to form a single crystalline, in place of a polycrystalline, cobalt silicide film on the silicon substrate having a planar direction of (100). To be more specific, if a silicon oxide film formed on a silicon substrate is reduced by titanium contained in the Co—Ti alloy film, an amorphous layer consisting essentially of titanium, silicon and oxygen is formed at the interface between the silicon substrate and the Co—Ti alloy film.

Where the particular amorphous layer is not formed, cobalt and silicon are diffused into each other, with the result that the reaction between cobalt and silicon takes place everywhere in the Co—Ti alloy film. Therefore, the reactions given below are successively brought about as shown in FIG. 7:

Co→Co$_2$Si→CoSi→CoSi$_2$

Figure 8:
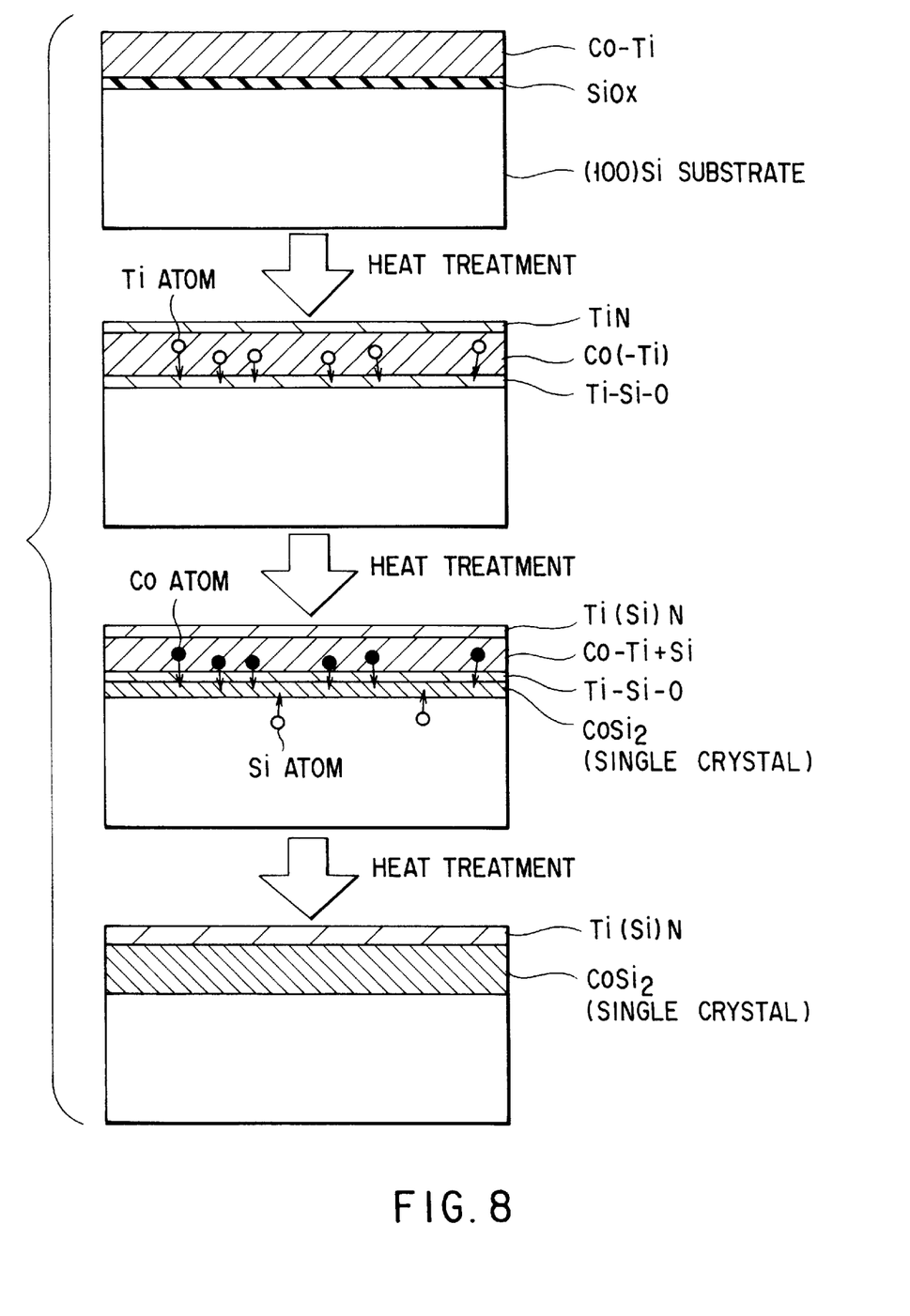
FIG. 8 schematically illustrates a silicidation reaction covering a case where a silicon oxide film of a predetermined thickness is present on the silicon surface in the step of depositing a cobalt-titanium alloy.

On the other hand, where the particular amorphous layer is formed at the interface between the silicon substrate and the Co—Ti alloy film, the supply of the cobalt atoms into the silicon substrate is limited by the amorphous layer, as shown in FIG. 8. In addition, the reaction of Co→CoSi$_2$ takes place only at the interface between the amorphous layer and the silicon substrate. The cobalt disilicide (CoSi$_2$) film is very close to silicon in crystal structure. As a result, an epitaxial growth of cobalt disilicide takes place at the interface between the amorphous layer and the silicon substrate so as to form a single crystalline cobalt disilicide film. It follows that, if a silicon oxide film of a predetermined thickness is formed in the step of forming a cobalt film containing titanium in the step shown in FIG. 1B, it is possible to form a single crystalline cobalt disilicide film in the heat treating step shown in FIG. 1C.

As described above, where a single crystalline cobalt disilicide film is formed on a silicon substrate having a planar direction of (100), an amorphous layer consisting essentially of titanium, silicon and oxygen and formed at the interface between the Co—Ti alloy film and the silicon substrate plays an important role. If the silicon oxide film formed on the surface of the source-drain diffusion layer 7 is unduly thin in depositing the cobalt film 8 containing titanium on the oxide film in the step shown in FIG. 1B, the cobalt disilicide film to be formed is rendered polycrystalline. It is experimentally confirmed that the thickness of the silicon oxide film required for forming a single crystalline cobalt disilicide film is at least 0.5 nm.

As described above, it is very important to control the thickness of the silicon oxide film formed on the silicon region before depositing a cobalt film containing titanium on the oxide film. In order to control the thickness of the silicon oxide film, the surface region in a predetermined thickness of the silicon region is oxidized again by a chemical treatment after the step of peeling the native oxide film. In this chemical treatment, it is important to control the concentrations of the oxidizing agents contained in the process solution such as ozone, active oxygen, nitrogen oxides, halogen oxides and hydrogen peroxide as well as the treating time. In addition, it is important to prevent the thickness of the silicon oxide film from being changed after the chemical treatment and before completion of depositing the cobalt film containing titanium.

Oxygen and steam present in the air atmosphere cause the thickness of the silicon oxide film to be increased with time. Therefore, it is important to retain the substrate after the treatment to control the thickness of the oxide film under an atmosphere having the oxygen and steam concentrations lower than those within the air atmosphere until a cobalt film containing titanium is deposited. According to the research conducted by the present inventors, the native oxide film grows to reach a maximum thickness of 3 nm when the humidity at room temperature exceeds 50% under the air atmosphere or an atmosphere of a mixed gas having a mixing ratio of oxygen to nitrogen of 1:4. It follows that it is necessary to maintain a humidity lower than 50% or to retain the substrate under an atmosphere having a low oxygen or carbon dioxide concentration. Incidentally, it is possible to suppress the thickness of the native oxide film at 1 nm or less by using a drying box loaded with silica gel, magnesia (MgO) or activated carbon and by maintaining the humidity at 20% or less.

As described above, it is possible in this embodiment to form a single crystalline cobalt disilicide film on a silicon substrate having a planar direction of (100), making it possible to improve the uniformity of the film, compared with a polycrystalline cobalt disilicide film. It is also possible to maintain the minimum distance between the bottom surface of the cobalt disilicide film and the gate oxide film and the minimum distance between the bottom surface of the cobalt disilicide film and the junction between the source-drain diffusion layers at large values. It follows that the deterioration in the gate withstand voltage and the leakage at the junction can be suppressed. It is also possible to improve the heat resistance of the cobalt silicide film.

FIGS. 2A to 2F are directed to a modification of the process shown in FIGS. 1A to 1F. Specifically, in the process shown in FIGS. 1A to 1F, the thin oxide film 30 was formed uniformly in the process shown in FIG. 1B after removal of the oxide film from the surfaces of the gate electrode and the source-drain diffusion layer. The step of forming the oxide film is important for obtaining a single crystalline cobalt disilicide film. However, the single crystalline cobalt disilicide film need not be formed in some cases, making it unnecessary to carry out the step for forming the oxide film. In the modification shown in FIGS. 2A to 2F, a silicon oxide film is not formed in the step shown in FIG. 2B, though the silicon oxide film is formed in the step shown in FIG. 1B.

Figure 2A:
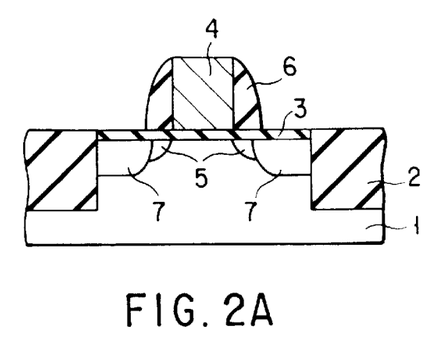
FIGS. 2A to 2F are cross sectional views collectively showing another manufacturing method of a semiconductor device according to the first embodiment of the present invention.
Figure 2B:
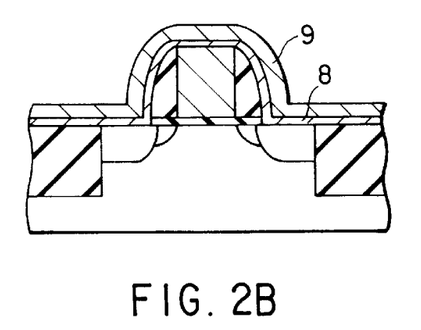
Figure 2C:
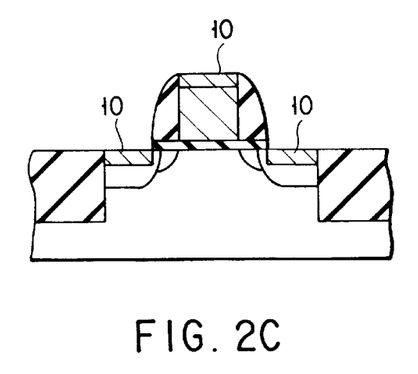
Figure 2D:
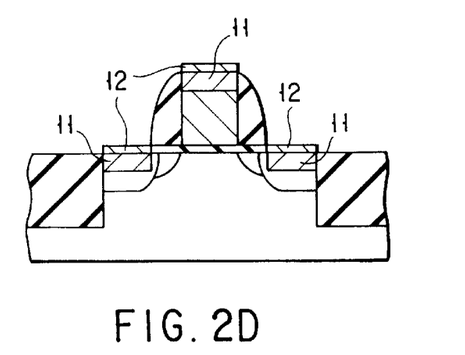
Figure 2E:
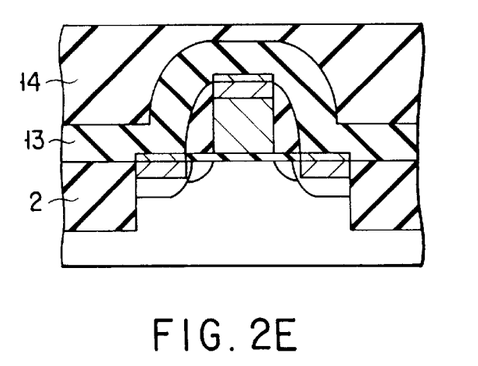
Figure 2F:
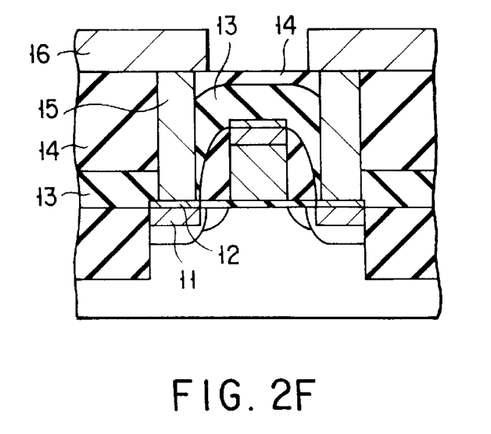

Even where an oxide film is not formed, a titanium nitride film is precipitated on the surface of the cobalt disilicide film 11 and at the crystal grain boundary in the step shown in FIG. 2D so as to obtain the effect of improving the heat resistance of the silicide film.

FIGS. 3A to 3E are directed to another modification of the process shown in FIGS. 1A to 1F. Specifically, in the process shown in FIGS. 1A to 1F, the cobalt film 8 containing titanium and the titanium nitride film 9 are formed in the step shown in FIG. 1B, followed by performing a lamp annealing at 550 to 700° C. in the step shown in FIG. 1C and subsequently performing an annealing treatment for a short time at about 800 to 900° C. in the step shown in FIG. 1D so as to form the cobalt disilicide film 11.

Figure 3A:
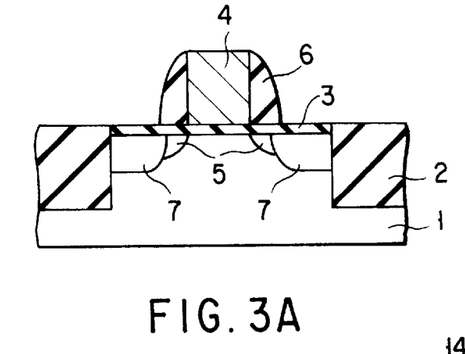
FIGS. 3A to 3E are cross sectional views collectively showing still another manufacturing method of a semiconductor device according to the first embodiment of the present invention.
Figure 3B:
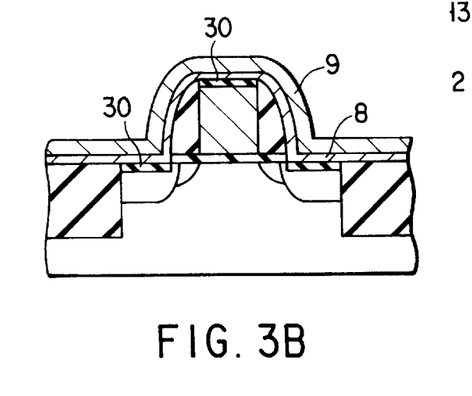
Figure 3C:
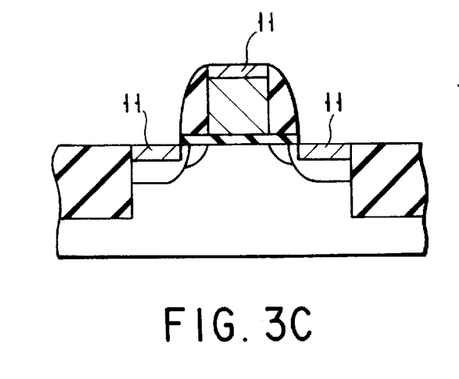
Figure 3D:
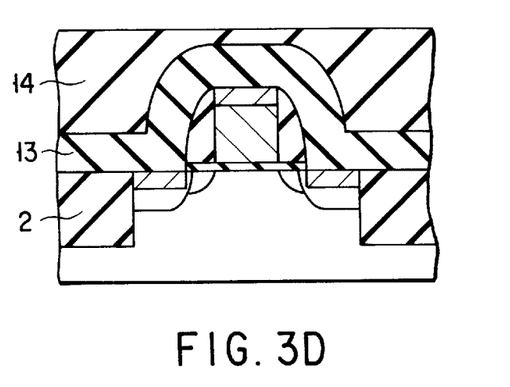
Figure 3E:
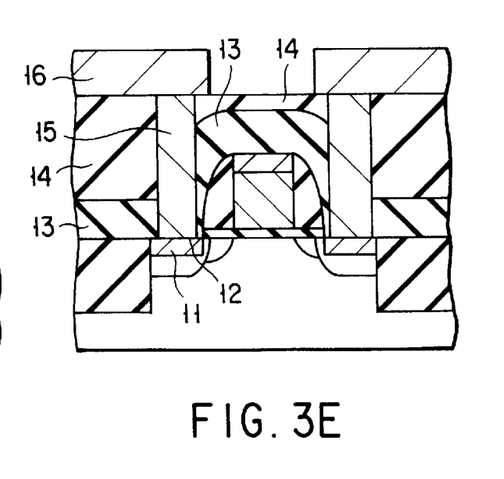

In the modification shown in FIGS. 3A to 3E, however, the cobalt film 8 containing titanium and the titanium nitride film 9 are formed in the step shown in FIG. 3B, followed by performing a lamp annealing treatment at about 800 to 900° C. under a nitriding atmosphere in the step shown in FIG. 3C. By this annealing treatment, a cobalt disilicide film is formed and, at the same time, a titanium nitride film is formed on the surface of the cobalt disilicide film. Then, the cobalt disilicide film 11 is selectively formed on the surfaces of the gate electrode and source-drain diffusion layer by removing by etching the titanium nitride film and the unreacted cobalt film.

In this modification, the titanium nitride film on the surface of the cobalt disilicide film 11 is removed by etching as shown in FIG. 3C so as to lose the effect as a diffusion barrier. However, since a titanium nitride film is precipitated at the crystal grain boundary of the cobalt disilicide film 11, it is possible to obtain the effect of improving the heat resistance of the silicide film.

In the embodiments described above, used is the cobalt film 8 containing titanium. However, it is possible to use zirconium (Zr), hafnium (Hf), vanadium (V), niobium (Nb) or tantalum (Ta) in place of titanium used as a second metal. It is also possible to use nickel (Ni), platinum (Pt) or palladium (Pd) in place of cobalt (Co) used as a first metal.

Where zirconium (Zr) or hafnium (Hf) is used as the second metal in place of titanium (Ti), substantially the same effect can be obtained because all of these metals belong to the 4A group. Specifically, in the step of depositing a cobalt film containing zirconium or hafnium as the second metal, the thickness of the thin silicon oxide film 30 formed on the surfaces of the gate electrode 4 and the deep source-drain diffusion layer 7 by the surface treatment with a mixed solution consisting of an aqueous solution containing an oxidizing agent such as ozone or hydrogen peroxide and hydrochloric acid, sulfuric acid or ammonia water is substantially equal to that in the case of using titanium. Also, the heat treating conditions for the silicidation using a lamp annealing apparatus and the etching conditions for removing the unreacted metal can be made substantially equal to those in the case of using titanium as the second metal.

In the case of using zirconium or hafnium as the second metal, zirconium nitride (ZrN) film or a hafnium nitride (HfN) film is formed on the surface or at the crystal grain boundary of the cobalt silicide film. However, the effect produced by the formation of the ZrN film or HfN film is substantially equal to the effect produced by the formation of the titanium nitride film.

Vanadium (V), niobium (Nb) and tantalum (Ta), which can be used in the present invention as the second metal, belong to 5A group and, thus, are somewhat inferior to the group 4A metal such as titanium in the reducing power of a silicon oxide film. Therefore, in the step of depositing a cobalt film containing a second metal, the thin silicon oxide film 30 formed on the surfaces of the gate electrode 4 and the deep source-drain diffusion layer 7 by the surface treatment with a mixed solution consisting of an aqueous solution containing an oxidizing agent such as ozone or hydrogen peroxide and hydrochloric acid, sulfuric acid or ammonia water is at most 0.8 times as thick as the effective thickness of the second metal, i.e., thickness of the cobalt alloy film multiplied by the concentration of the second metal, i.e., V, Nb or Ta. On the other hand, the heat treating conditions for silicidation using a lamp annealing apparatus and the etching conditions for removing the unreacted metal are substantially equal to those in the case of using titanium as the second metal.

In the case of using V, Nb or Ta as the second metal, a vanadium nitride (VN) film, a niobium nitride (NbN) film or a tantalum nitride (TaN) film is formed on the surface or at the crystal grain boundary of the cobalt silicide film. However, the resultant effect is substantially equal to that which is obtained in the case of using titanium as the second metal.

Where nickel is used as a first metal in place of cobalt, a nickel disilicide ($NiSi_2$) film is formed by the process equal to that in the case of using cobalt so as to obtain an effect substantially equal to that obtained in the case of using cobalt as the first metal.

Where platinum (Pt) or palladium (Pd) is used as a first metal in place of cobalt, the silicide of a low resistivity which can be present stably on the silicon substrate is platinum monosilicide (PtSi) or dipalladium silicide ($Pd_2Si$).

In order to form such a silicide film, it is desirable to achieve silicidation of the metal in the first heat treatment. To achieve the object, a platinum film containing titanium or a palladium film containing titanium is formed together with a titanium nitride film in the step shown in FIG. 3B, followed by performing a lamp annealing at about 300 to 650° C. in the step shown in FIG. 3C so as to form a platinum monosilicide (PtSi) film or a dipalladium silicide ($Pd_2Si$) film, as exemplified in the process shown in FIGS. 3A to 3E. Then, the titanium nitride film and the unreacted platinum film or palladium film are removed by etching so as to form a silicide film on the surfaces of the gate electrode and the deep source-drain diffusion layer. $(C_2H_5)_4NBr$ dissolved in acetonitrile is used as an etchant of palladium, and aqua regia is used as an etchant of platinum.

In this embodiment, a titanium nitride film is precipitated at the crystal grain boundary of the silicide film so as to improve the heat resistance of the silicide film.

Figure 9A:
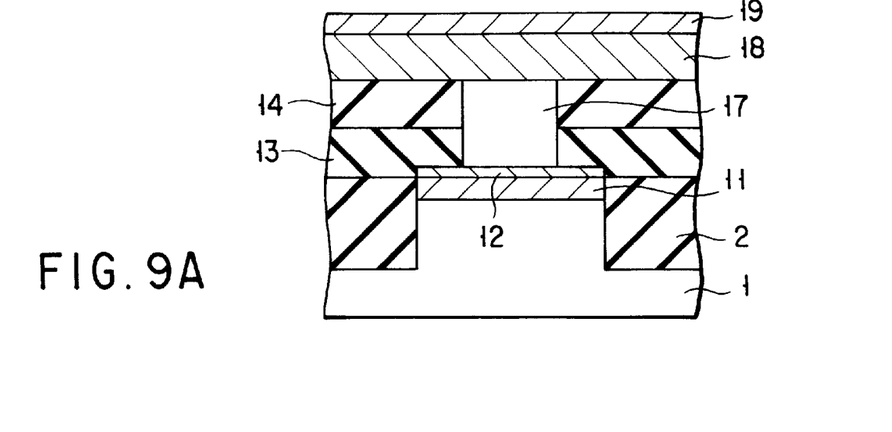
FIGS. 9A to 9C are cross sectional views collectively showing a manufacturing method of a semiconductor device according to a second embodiment of the present invention.
Figure 9B:
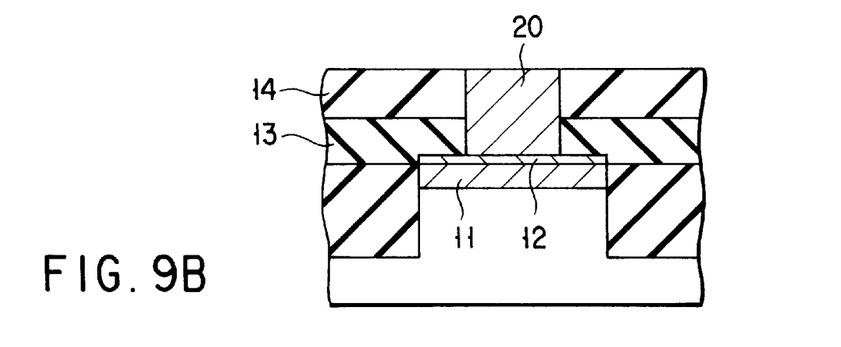
Figure 9C:
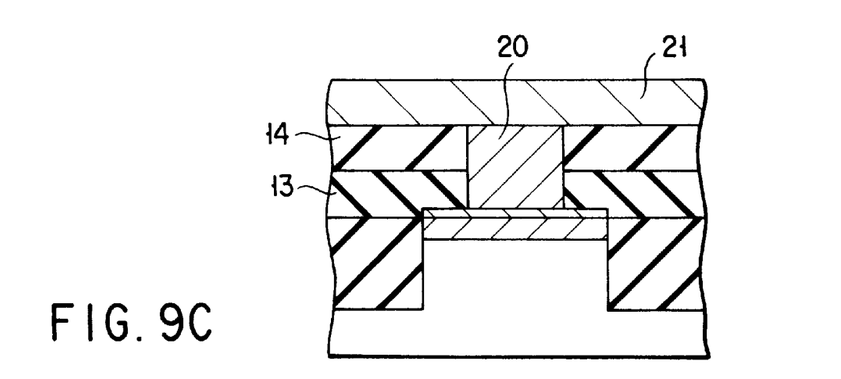

Let us describe a second embodiment of the present invention with reference to FIGS. 9A to 9C.

The steps for forming a MOS transistor in the second embodiment are equal to those of the first embodiment shown in FIG. 1 and, thus, the first embodiment is referred to in some portions of the second embodiment so as to avoid an overlapping description.

Specifically, after formation of the structure shown in FIG. 1D, in which the surface of the cobalt silicide film 11 is covered with the titanium nitride film 12, interlayer insulating films (silicon oxide films) 13 and 14 are deposited on the entire surface, followed by forming a contact hole. Then, an amorphous silicon is deposited on the entire surface, followed by etching back the amorphous silicon so as to permit an amorphous silicon layer 17 to be left only within the contact hole. Further, an aluminum film 18 and a titanium film 19 are deposited on the entire surface, as shown in FIG. 9A.

In the next step, a heat treatment is applied at 600° C. or less so as to bring about reactions among the amorphous silicon layer 17, the aluminum film 18 and the titanium film 19 so as to permit the amorphous silicon layer 17 within the contact hole to be replaced by an aluminum layer 20. Further, the aluminum film 18 and the titanium film 19 positioned outside the contact hole and the silicon layer 17 sucked out by the replacement reaction are removed by a CMP, etc., as shown in FIG. 9B.

Finally, a wiring metal layer 21 made of, for example, aluminum is deposited on the entire surface, followed by patterning the wiring metal layer 21 such that the wiring layer 21 is electrically connected to the semiconductor element region, as shown in FIG. 9C.

In the embodiment described above, the surface of the silicide film 11 is covered in advance with the titanium nitride film 12 performing a high diffusion barrier function so as to prevent the occurrence of an aluminum spike. Also, since it is unnecessary to deposit a titanium nitride film within the contact hole, the number of treating steps is not increased. In addition, it is possible to prevent the resistance from being increased by the narrowing of the contact hole.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising:
   the step of forming a silicon region partitioned by insulating films on a main surface region of a substrate;
   the step of forming a mixed film of first and second metals directly or indirectly on the substrate having the silicon region formed therein;
   the step of selectively forming by a heat treatment a silicide film on the surface of the silicon region by the reaction between the metal within the mixed film and silicon in the silicon region; and
   wherein the first metal is at least one metal selected from the group consisting of cobalt (Co), nickel (Ni), platinum (Pt) and palladium (Pd); and the second metal is at least one metal selected from the group consisting of titanium (Ti), zirconium (Zr), hafnium (Hf), vanadium (V), niobium (Nb) and tantalum (Ta).

2. The method of manufacturing a semiconductor device according to claim 1, wherein the step of selectively forming by a heat treatment a silicide film on the surface of the silicon region by the reaction between the metal within the mixed film and silicon in the silicon region includes:
   the process of selectively forming by a heat treatment a first silicide film on the surface of the silicon region by the reaction among the first metal, the second metal and silicon in the silicon region; and
   the process of subjecting the first silicide film to a heat treatment under a nitriding atmosphere so as to form a second silicide film consisting essentially of the first metal and silicon on the surface of the silicon region and a nitride film consisting essentially of the second metal and nitrogen on the surface of the second silicide film or both on the surface of the second silicide film and at the crystal grain boundary of the second silicide film.

3. The method of manufacturing a semiconductor device according to claim 1, wherein:
   the step of forming a mixed film of first and second metals directly or indirectly on the substrate having the silicon region formed therein includes the process of forming a silicon oxide film on the surface of the silicon region, and the process of forming a mixed film of the first and second metals on the substrate having the silicon oxide film formed thereon; and
   the step of selectively forming by a heat treatment a silicide film on the surface of the silicon region by the reaction between the metal within the mixed film and silicon in the silicon region includes the process of allowing the silicon oxide film formed on the surface of the silicon region to be reduced by the second metal, and the process of selectively forming a silicide film on the surface of the silicon region by the reaction between the first metal and silicon in the silicon region.

4. The method of manufacturing a semiconductor device according to claim 3, wherein the thickness of the silicon oxide film formed on the surface of the silicon region is not larger than an effective thickness of the second metal contained in the mixed film, said effective thickness being obtained by multiplying the thickness of the mixed film by a ratio of the second metal contained in the mixed film.

5. The method of manufacturing a semiconductor device according to claim 3, wherein the thickness of the silicon oxide film formed on the surface of the silicon region is at least 0.5 nm.

6. The method of manufacturing a semiconductor device according to claim 1, wherein the step of selectively forming by a heat treatment a silicide film on the surface of the silicon region by the reaction between the metal within the mixed film and silicon in the silicon region includes a heat treatment under a nitriding atmosphere to form a silicide film consisting essentially of the first metal and silicon on the surface of the silicon region and a nitride film consisting essentially of the second metal and nitrogen at the crystal grain boundary of the silicide film.

7. The method of manufacturing a semiconductor device according to claim 1, wherein the mixed film of said first and second metals is formed by means of sputtering.

8. A method of manufacturing a semiconductor device, comprising:

the step of selectively forming a silicide film consisting essentially of a first metal and silicon on a surface of a silicon region partitioned by first insulating films on a main surface region of a substrate and a nitride film consisting essentially of a second metal and nitrogen on the surface of the silicide film or both on the surface of the silicide film and at the crystal grain boundary of the silicide film;

the step of forming a second insulating film, said second insulating film having an opening on the nitride film;

the step of burying amorphous silicon in the opening of the second insulating film;

the step of forming an aluminum layer on the amorphous silicon layer; and the step of applying a heat treatment to have the amorphous silicon layer replaced by the aluminum layer so as to bury the aluminum layer in the opening.

* * * * *